(12) United States Patent
Kim

(10) Patent No.: US 8,451,643 B2
(45) Date of Patent: May 28, 2013

(54) SEMICONDUCTOR MEMORY DEVICE REWRITING DATA AFTER EXECUTION OF MULTIPLE READ OPERATIONS

(75) Inventor: Doo Gon Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 389 days.

(21) Appl. No.: 12/775,744

(22) Filed: May 7, 2010

(65) Prior Publication Data

US 2010/0290278 A1    Nov. 18, 2010

(30) Foreign Application Priority Data

May 14, 2009 (KR) .................... 10-2009-0042183

(51) Int. Cl.
*G11C 11/00* (2006.01)
(52) U.S. Cl.
USPC ....... 365/148; 365/205; 365/230.03; 365/236
(58) Field of Classification Search
USPC .............. 365/148, 189.16, 205, 230.03, 236
See application file for complete search history.

(56) References Cited

U.S. PATENT DOCUMENTS

| 6,700,815 | B2 | 3/2004 | Le et al. | |
|---|---|---|---|---|
| 2008/0158941 | A1* | 7/2008 | Choi et al. | 365/163 |
| 2009/0285008 | A1* | 11/2009 | Jeong et al. | 365/148 |

FOREIGN PATENT DOCUMENTS

| JP | 2005025903 A | 1/2005 |
|---|---|---|
| KR | 1020040052409 A | 6/2004 |
| KR | 1020050042183 A | 5/2005 |

* cited by examiner

*Primary Examiner* — Hoai V Ho
(74) *Attorney, Agent, or Firm* — Volentine & Whitt, PLLC

(57) ABSTRACT

Provided is a semiconductor memory device including a memory cell; a writing driver providing a program current to the memory cell to write data in the memory cell; a sense amplifier processing a read operation reading data written in the memory cell; and a controller providing a rewriting signal for rewriting data read from the sense amplifier in the memory cell to the writing driver after the sense amplifier repeatedly applies a read operation more than a predetermined number of times.

16 Claims, 10 Drawing Sheets

US 8,451,643 B2

SEMICONDUCTOR MEMORY DEVICE REWRITING DATA AFTER EXECUTION OF MULTIPLE READ OPERATIONS

CROSS-REFERENCE TO RELATED APPLICATIONS

This U.S. non-provisional patent application claims priority under 35 U.S.C. §119 to Korean Patent Application No. 10-2009-0042183 filed on May 14, 2009, the subject matter of which is hereby incorporated by reference.

BACKGROUND

The present disclosure relates to semiconductor memory devices, and more particularly, to semiconductor memory devices having an enhanced capability to prevent data loss.

Semiconductor memory devices may be classified as volatile and nonvolatile in their operative nature. Volatile memory devices lose stored data in the absence of applied power, and include, for example, dynamic random access memory (DRAM) and static random access memory (SRAM). Nonvolatile memory devices retain stored data in the absence of applied power, and include, for example, programmable ROM (PROM), erasable PROM (EPROM), electrically EPROM (EEPROM) and flash memory. Other next generation types of non-volatile memory include ferroelectric random access memory (FRAM), magnetic random access memory (MRAM), phase change random access memory (PRAM), and resistive random access memory (RRAM). These forms of next generation, non-volatile, semiconductor memory devices exhibit different resistances according to an applied current or voltage as a means of storing different logic data states.

Among the next generation, non-volatile, semiconductor memory devices, the PRAM is characterized by high operating speed and a structure susceptible to dense integration density. Accordingly, the PRAM has been the subject of considerable ongoing research and development.

SUMMARY

Embodiments of the inventive concept provide a memory system comprising, a nonvolatile semiconductor memory device, comprising; a memory cell array comprising a plurality of nonvolatile memory cells including a target memory cell, and an input/output (I/O) circuit comprising; a writing driver configured to apply a program current to the target memory cell during a write operation in order to write data to the target memory cell, and a sense amplifier configured to store read data retrieved during a read operation directed to the target memory cell, and a controller configured to count a number of consecutive read operations applied to the target memory cell and provide a rewriting signal to the I/O circuit when the counted number of consecutive read operations reaches a defined read operation threshold, wherein the applied rewriting signal causes a data rewriting operation to be executed in the nonvolatile semiconductor memory device rewriting the data to the target memory cell.

Embodiments of the inventive concept also provide a method of operating a memory system including a nonvolatile semiconductor memory device comprising a memory cell array comprising a plurality of nonvolatile memory cells including a target memory cell. The method comprises; performing a write operation to write data to the target memory cell; and thereafter, performing a number of consecutive read operations to read data from the target memory cell and counting the number of consecutive read operations, and when the number of counted consecutive read operations reaches a defined read operation threshold, executing a data rewriting operation to rewrite the data to the target memory cell.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the figures.

DETAILED DESCRIPTION OF THE EMBODIMENTS

Several embodiments of the inventive concept will now be described in some additional detail with reference to the accompanying drawings. The inventive concept may, however, be embodied in different forms and should not be constructed as being limited to only the illustrated embodiments. Rather, these embodiments are presented as teaching examples. Throughout the written description and drawings, like reference numbers refer to like or similar elements.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

By way of example, certain embodiments of the inventive concept will be described in the context of variable resistance memory devices using one or more phase change material(s).

Figure 1A:
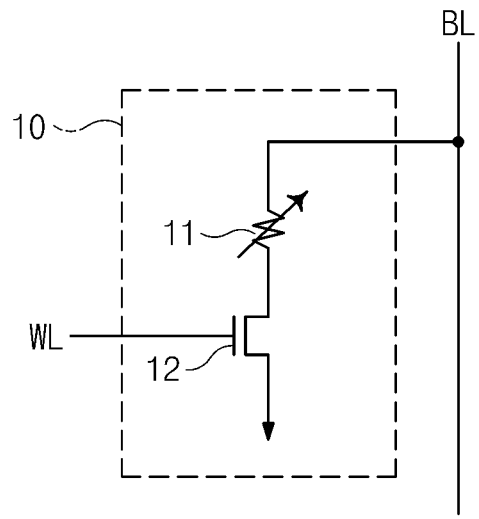
FIG. 1A and FIG. 1B are circuits illustrating a unit memory cell of a variable change memory device.
Figure 1B:
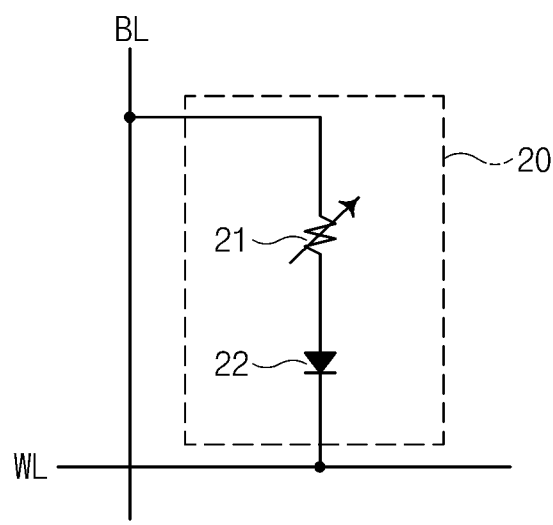
Figure 2:
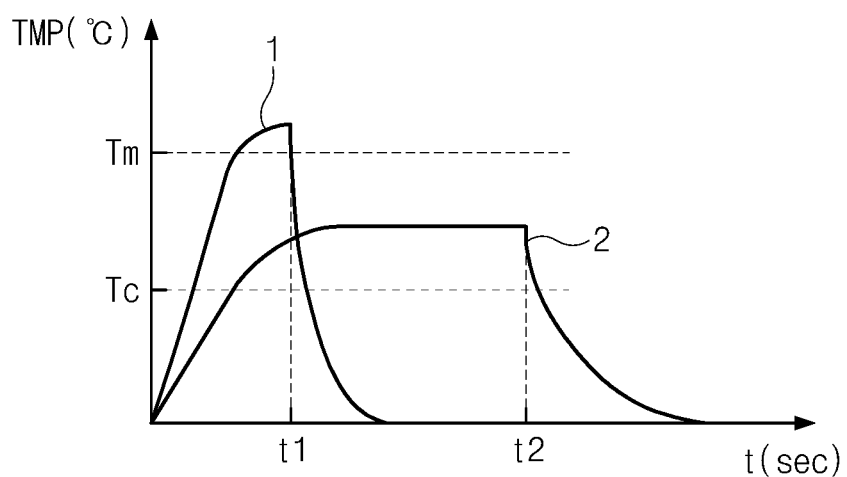
FIG. 2 is a graph illustrating a characteristic of a variable resistance material.

FIGS. 1A and 1B are circuit diagrams illustrating a unit memory cell for a semiconductor memory device susceptible to incorporation within an embodiment of the present inventive concept. FIG. 2 is a graph illustrating programming characteristics for a variable resistance material assumed to be used in the unit memory cell of FIGS. 1A and 1B.

Referring to FIG. 1A, a memory cell includes a variable resistance device 11 and a select device 12. The variable resistance device 11 is connected between a bit line (BL) and the select device 12. The select device 12 is connected between the variable resistance device 11 and a ground.

The variable resistance device 11 includes a phase change material exhibiting a resistance that changes according to temperature, such as like Ge—Sb—Te (GST). Such a phase change material may be placed in an amorphous state having a relatively high resistance, or a crystalline state having a relatively low resistance. The state of the variable resistance device 11 may be set (or programmed) according to a quantity of current applied to the corresponding bit line (BL).

The select device 12 may be constituted by an NMOS transistor and a word line (WL) is connected to a gate of the NMOS transistor. Thus, a current supply to the variable resistance device 11 is controlled according to a voltage of the word line (WL). Although the select device 12 is connected between the variable resistance device 11 and the ground in FIG. 1A, the select device 12 may be connected between the bit line (BL) and the variable resistance device 11.

Referring to FIG. 1B, a memory cell 20 includes a variable resistance device 21 and a select device 22 like FIG. 1A. Unlike FIG. 1, the select device 22 is constituted by a diode. The variable resistance device 21 is connected between the bit line (BL) and the select device 22. The select device 22 is connected between the variable resistance device 21 and a word line (WL). In the select device 22, an anode of the diode is connected to the variable resistance device 21 and a cathode of the diode is connected to the word line (WL). When a voltage difference between an anode of the diode and a cathode of the diode is greater than a threshold voltage, the diode is turned on and thereby a current may be supplied to the variable resistance device.

Referring to FIG. 2, the programming characteristics for the phase change material included in the memory cells of FIGS. 1A and 1B are described in relation to temperature (TMP) and temperature application timing (t). Graph (1) of FIG. 2 result in the amorphous state and graph (2) results in the crystalline state. That is, the phase change material forming the variable resistance device becomes amorphous when it is heated to a temperature higher than a melting temperature (Tm) and then rapidly cooled. The amorphous state is commonly associated with a reset state or a stored data value of "1". The phase change material becomes crystalline when it is heated to and held above a temperature higher than a crystallization temperature (Tc) but less than the melting temperature (Tm) and then gradually cooled. The crystalline state is commonly associated with a set state or a stored data value of "0".

These distinct material states may thus be used to effectively store data in a non-volatile manner, wherein each corresponding programmed logic state may be identified by a different resistance when electrical current is passed through the phase change material.

Even though conventional variable resistance memory devices have excellent data retention qualities, they may yet suffer from certain conditions that result in data loss, such as repeated (or excessive) reading of a programmed memory cell. That is, after a certain number of read operation cycles being applied to a conventional variable resistance memory cell, its programmed state may begin to break-down under the wear and tear of repeatedly applied current, thereby resulting in the possible loss of data. In contrast, a variable resistance memory device designed and operated according to an embodiment of the inventive concept is able maintain stored data even when a normally excessive number of read operations are performed.

An exemplary semiconductor memory device having memory cells including a phase change material such as those described above is shown in the block diagram of FIG. 3.

Figure 3:
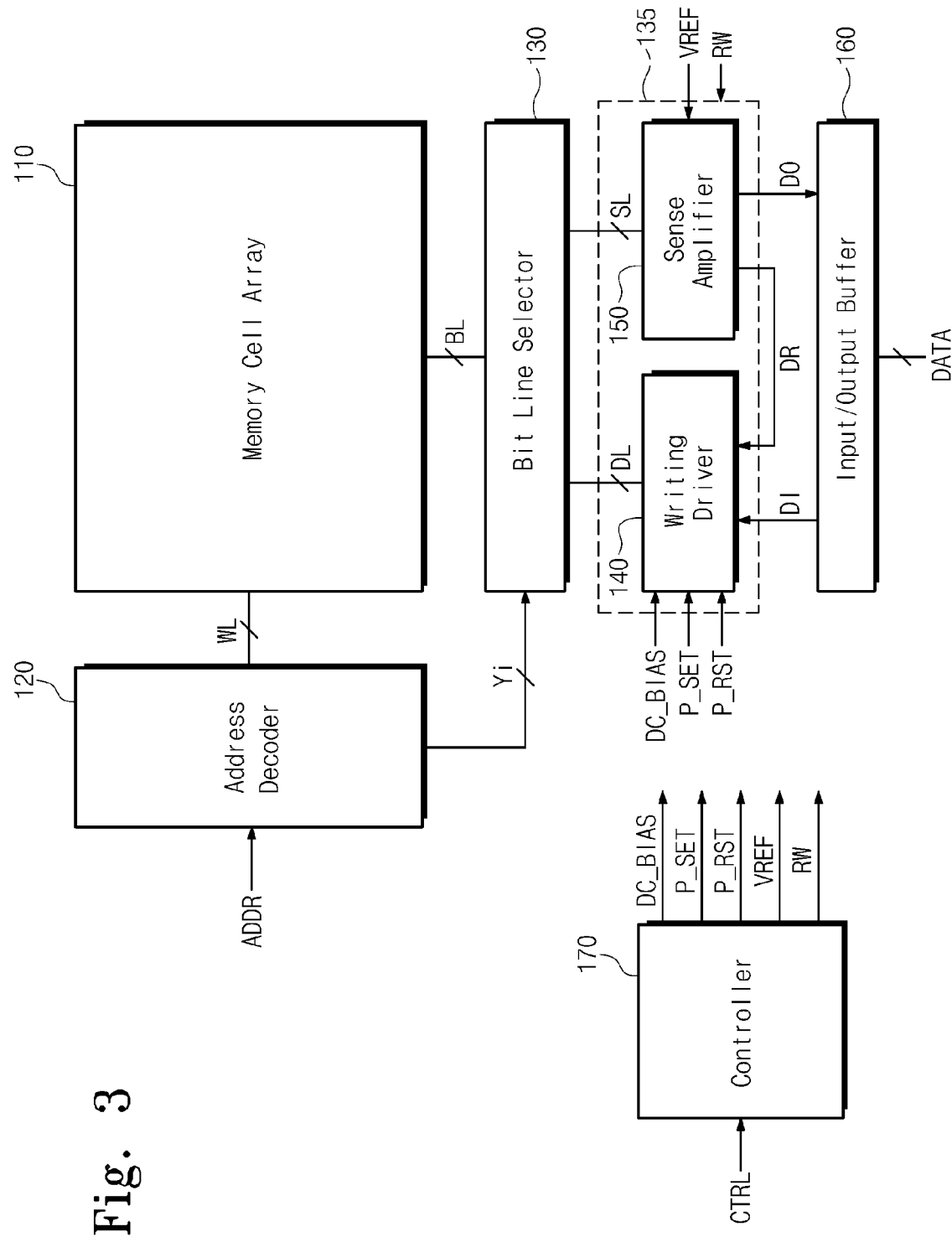
FIG. 3 is a block diagram of a variable resistance memory device in accordance with embodiments of the inventive concept.

Referring to FIG. 3, a variable resistance memory device in accordance with an embodiment of the inventive concept comprises a memory cell array 110, an address decoder 120, a bit line selector 130, a writing driver 140, a sense amplifier 150, an input/output buffer 160 and a controller 170.

The memory cell array 110 includes a plurality of word lines (WL) and a plurality of bit lines (BL), and phase change memory cells are disposed at points where word lines (WL) and bit lines (BL) cross one another. The memory cell array 110 is further described with reference to FIGS. 4 through 10.

The address decoder 120 is connected to the memory cell array 110 through word lines (WL). The address decoder 120 decodes an address (ADDR) received from the outside to select a word line (WL) and a bit line (BL). The address (ADDR) includes a row address to select a word line (WL) and a column address to select a bit line (BL). The address decoder 120 generates a bit line select signal (Yi) to select a bit line (BL) and provides the bit line select signal (Yi) to the bit line selector 130.

The bit line selector 130 is connected to the memory cell array 110 through bit lines (BL). The bit line selector 130 is connected to a data input/output circuit 135 through a data line (DL) and a sensing line (SL). The bit line selector 130 electrically connects a bit line (BL) to a data line (DL) or electrically connects a bit line (BL) to a sense line (SL) in response to the bit line select signal (Yi) provided from the address decoder 120.

The data input/output circuit 135 writes data (DI) in the memory cell array 110 or reads data (DO) from the memory cell array 110. Also, the data input/output circuit 135 can rewrite data (DR) read from the memory cell array 110 in the memory cell array. To achieve this, the data input/output circuit 135 includes the writing driver 140 and the sense amplifier 150.

The writing driver 140 provides a program (or a writing) current to the selected bit line (BL) through the data line (DL) when a writing operation is performed. More specifically, the writing driver 140 receives a set pulse (P_SET) or a reset pulse (P_RST) to generate a set current or a reset current. The writing driver 140 receives data (DI) from the input/output buffer 160 to provide a set current or a reset current to the selected global bit line (GBL0). Also, the writing driver 140 can control the amount of currents being provided to the selected bit line (BL) according to a bias voltage (DC_BIAS) provided from the controller 170. That is, the writing driver 140 provides a set current in response to the set pulse (P_SET) when receiving data '0' and provides a reset current in response to the reset pulse (P_RST) when receiving data '1'. The writing driver 140 is described in some additional detail with reference to FIG. 8.

The sense amplifier 150 reads data (DO) of the selected memory cell through the sense line (SL) when a read operation is performed. More specifically, the sense amplifier 150 provides a read current to the memory cell array 110 through the sense line (SL) when a read operation is performed. The sense amplifier 150 can read data (DO) which is stored in a memory cell by comparing a voltage of the sense line (SL) with a reference voltage when a read operation is performed. Data (DO) read through the sense amplifier 150 can be outputted to the outside through the input/output buffer 160. The sense amplifier 150 is described in some additional detail with reference to FIG. 10.

The input/output buffer 160 provides data (DATA) inputted from the outside to the writing driver 140 or outputs data (DATA) read from the sense amplifier 150 to the outside.

The controller 170 outputs control signals controlling a semiconductor memory device according to a command signal (CTRL) provided from the outside. That is, the controller 170 controls an operation of the writing driver 140 when a writing operation is performed and controls an operation of the sense amplifier 150 when a read operation is performed. More specifically, the controller 170 provides the set pulse (P_SET) or the reset pulse (P_RST) to generate a program current to the writing driver 140 when a writing operation is performed. The controller 170 provides a bias voltage (DC_BIAS) to control the amount of currents being provided to memory cells to the writing driver 140. The controller 170 provides a reference voltage (VREF) to be compared with a voltage of the sense line (SL) to the sense amplifier 150 when a read operation is performed.

Also, the controller 170 provides a data rewriting signal (RW) to the data input/output circuit 135 to prevent data loss of a memory cell. In the data input/output circuit 135, data (DR) read from the sense amplifier 150 is rewritten in a memory cell through the writing driver 140 by the data rewriting signal (RW). More specifically, the controller 170 provides the data rewriting signal (RW) to the writing driver 140 according to a number of read operations executed by the sense driver 140. To achieve this, the controller 170 (or an analogous external circuit) will count the number of data read operations executed by the sense amplifier 150 in relation to a particular memory cell or a particular subset of memory cells in memory cell array 110. If the read operation is repeatedly performed more than the predetermined number of times before the memory cell or subset of memory cells is again programmed (i.e., the number of read operations exceeds a "read operation threshold"), the controller 170 will then provide the data rewriting signal (RW) to the writing driver 140. Since the data rewriting signal (RW) is applied to the writing driver 140 following a "last read operation" (i.e., the read operation exceeding the read operation threshold), the writing driver 140 may simply "rewrite" the read data currently stored in the sense amplifier back into the memory cell (or subset of memory cells) at the corresponding address(es) from which the data has been read during the last read operation.

For example, if the data rewriting signal (RW) is applied to the data input/output circuit 135 following a last read operation directed to corresponding "last read data" stored in target memory cell (i.e., a memory cell undergoing a number of read operations exceeding the read operation threshold), then the last data resulting from the last read operation will be provided to the writing driver 140. The writing driver 140 will then rewrite the last read data to the target memory cell. Accordingly, before the read data stored in a target memory cell can be lost due to excessive read operations, said data may be essentially restored by application of a "data rewriting operation" to the target memory cell.

Figure 4:
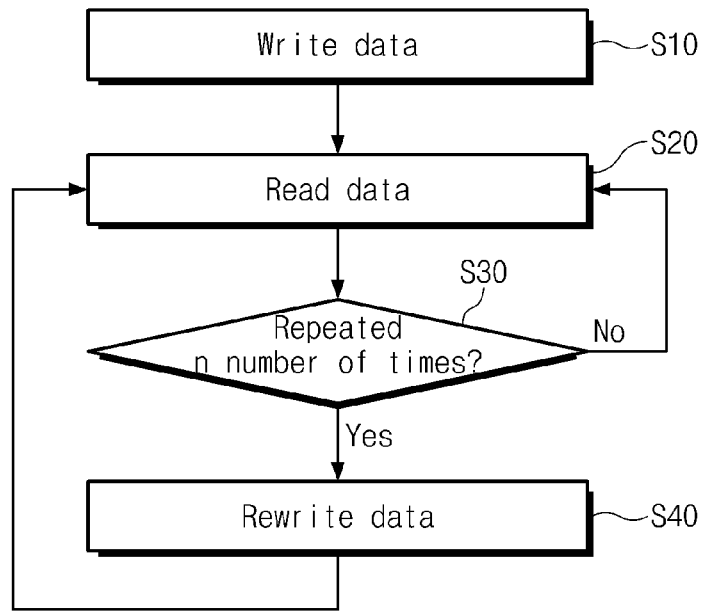
FIG. 4 is a flow chart illustrating data rewriting operation of a variable resistance memory device in accordance with an embodiment of the inventive concept.

A data rewriting operation executed in relation to a variable resistance memory device according to an embodiment of the inventive concept will be described with reference to FIGS. 3 and 4. FIG. 4 is a flow chart summarizing a data rewriting operation for a semiconductor memory device in accordance with an embodiment of the inventive concept.

Referring to FIGS. 3 and 4, data (DI) is initially written to a target memory cell after being conventionally selected by operation of address decoder 120, bit line selector 130, and writing driver 140 (S10). (A single target memory cell is assumed for simplicity of explanation, but those skilled in the art will recognize that a selected plurality or subset of memory cells may be the target memory cells). That is, the bit line selector 130 electrically connects the data line (DL) to the selected bit line (BL) in response to the bit line select signal (Yi). Data to be written to the target memory cell is provided to the writing driver 140 through the data input/output buffer 160 and the set pulse (P_SET) and the reset pulse (P_RST) are enabled to be provided to the writing driver 140. A set current or a reset current is provided to a memory cell from the writing driver 140 through the data line (DL) and the bit line (BL). As a result, a data value of '1' or '0' is written to the selected target memory cell(s).

At some point after it has been written (programmed) to the selected target memory cells, the data (DO) is read during a read operation via the sense amplifier 150 (S20). That is, during the read operation, a row address and a column address are provided to the memory cell array 110 through the address decoder 120 to select the target memory cell from which data is to be read. The bit line selector 130 electrically connects the sense line (SL) to the selected bit line (BL) in response to the bit line select signal (Yi). The sense amplifier 150 provides a read current (or a bias current) to a memory cell through the sense line (SL) and compares a voltage of the sense line (SL) with the reference voltage (VREF) during a sense operation to read data stored in the target memory cell.

The read operation, as applied the target memory cell, may be repeated (e.g.) many thousands of times in response to host device or user commands. This excessive repletion of read operations may conventionally result in the loss of coherency for the data (DO) stored in the target memory cell. Thus, according to certain embodiments of the inventive concept, the controller 170 will count a number of "consecutive read operations" (i.e., read operations sequentially applied to a target memory cell between applications of operations changing or reprogramming the stored data (DO), such as write/program or erase operations.) So long as the counted number of consecutive read operations remains below the defined read operation threshold "N" (S30=No), the memory system operates conventionally and continues to perform consecutive read operations, or intervening write/erase operations.

However, when the counted number of consecutive read operations reaches the read operation threshold (S30=Yes), the memory system, under the control of controller 170 causes a data rewriting operation to be executed (S40). The data rewriting operation (or any other intervening write/erase operation) directed to the target memory cell, causes the count of consecutive read operations to be reset to zero. In the illustrated memory system, the data rewriting operation is initiated by the controller 70 providing the data rewriting signal (RW) to the writing driver 140, thereby causing the last read data currently stored in the sense amplifier 150 to be "re-written" to the target memory cell using conventional write (program) operations circuits and techniques.

Figure 5:
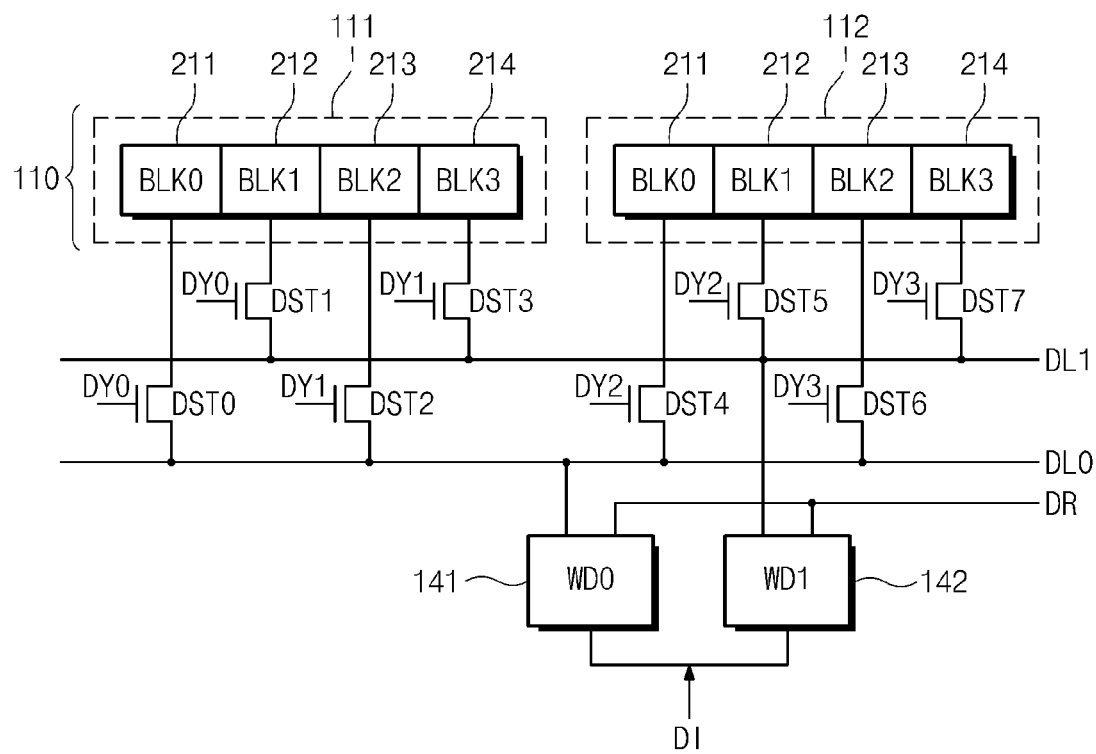
FIG. 5 is a block diagram illustrating a connection between a memory cell array and a writing driver in a variable resistance memory device in accordance with an embodiment of the inventive concept.

FIG. 5 is a block diagram illustrating one possible connection between the memory cell array 110 and writing driver 140 in a variable resistance memory device according to an embodiment of the inventive concept. The memory cell array 110 includes a plurality of block units 111 and 112 and each of the block units 111 and 112 includes a plurality of memory blocks 211 through 214. Although two block units 111 and 112 including four memory blocks 211 through 214 respectively are described in FIG. 5 for convenience of description, the inventive concept is not limited to only this particular configuration.

Referring to FIG. 5, the memory cell array 110 includes a first block unit 111 and a second block unit 112 and may include writing drivers 141 and 142 corresponding to the first block unit 111 and the second block unit 112 respectively. Each of the block units 111 and 112 includes first through fourth memory blocks 211 through 214. Each of the memory blocks 211 through 214 includes a plurality of phase change memory cells like things illustrated in FIGS. 1A and 1B. Each of the memory blocks 211 through 214 may be selectively connected to the first writing driver 141 or the second writing driver 142 by data line select transistors (DST0-DST7). The data line select transistors (DST0-DST7) can connect the memory blocks 211 through 214 to the writing driver 141 or the second writing driver 142 in response to a data line select signal (DYi). More specifically, first and third memory blocks 211 and 213 of each of the block units 111 and 112 may be connected to the first writing driver 141 and second and fourth memory blocks 212 and 214 of each of the block units 111 and 112 may be connected to the second writing driver 142. That is, four data writing operations are performed through the first and second writing drivers 141 and 142 to write the first and second block units 111 and 112.

If the data rewriting signal (RW) is applied to the first and second writing driver 141 and 142, the first and second writing driver 141 and 142 rewrite data (DR) provided from sense amplifiers (151-158 of FIG. 6) in each of the memory blocks 211 through 214. At this time, since the number of the writing drivers 141 and 142 is less than the number of sense amplifiers (151 through 158 of FIG. 6), a rewriting operation may be repeated in the first and second writing drivers 141 and 142 until all the read data are rewritten in each of the memory blocks 211 through 214.

Figure 6:
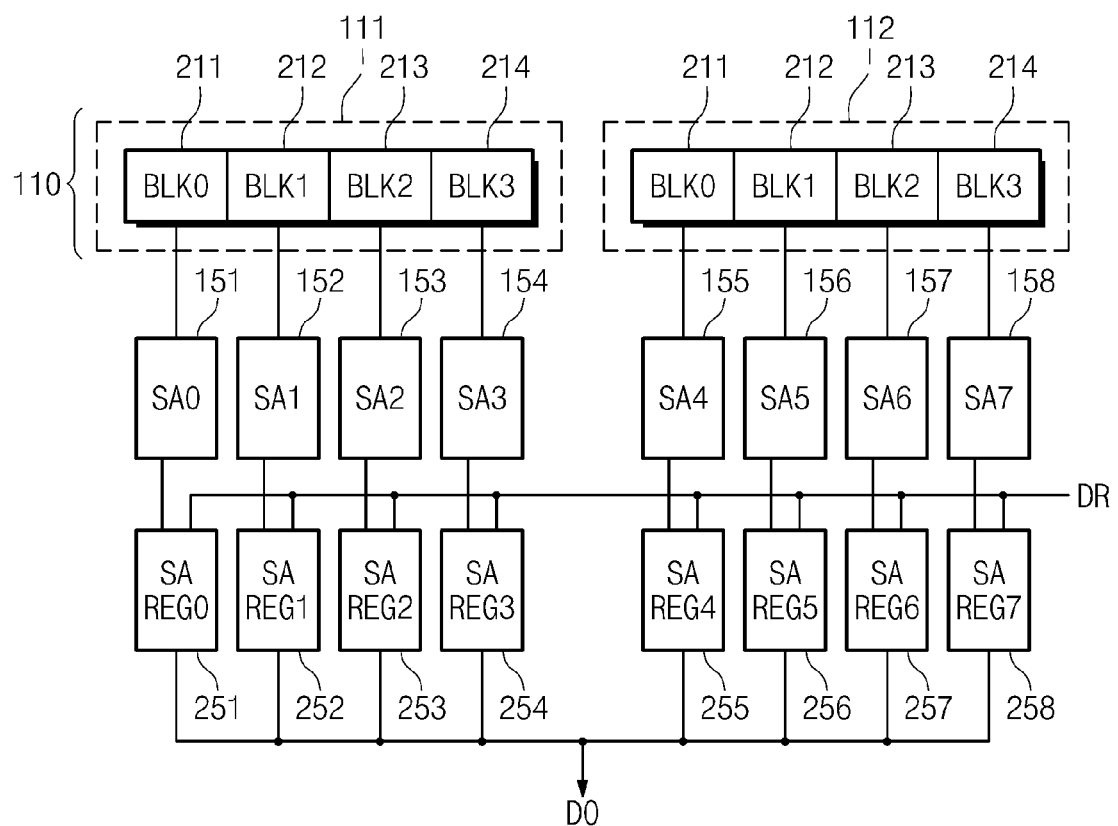
FIG. 6 is a block diagram illustrating a connection between a memory cell array and a sense amplifier in a variable resistance memory device in accordance with an embodiment of the inventive concept.

FIG. 6 is a block diagram illustrating another possible connection between the memory cell array 110 and the sense amplifier 150 in a variable resistance memory device according to an embodiment of the inventive concept.

Referring to FIG. 6, a memory cell array 110 includes a plurality of block units 111 and 112 and each of the block units 111 and 112 includes a plurality of memory blocks 211 through 214. That is, the memory cell array 110 includes first and second block units 111 and 112, and each of the block units 111 and 112 includes first through fourth memory blocks 211 through 214. Each of the memory blocks 211 through 214 includes a plurality of phase change memory cells like things illustrated in FIGS. 1A and 1B. Sense amplifiers 151 through 158 corresponding to the memory blocks 211 through 214 respectively are connected to the memory blocks 211 through 214 through sense lines (SL0-SL7). Also, the sense amplifiers 151 through 158 may be connected to sense amplifier registers 251 through 258 respectively and data read from the memory blocks 211 through 214 are temporally stored in the sense amplifier registers 251 through 258. Data can be read from all the memory blocks 211 through 214 by one time read operation to be stored in the sense amplifier registers 251 through 258. Thus, in one embodiment a semiconductor memory device according to the inventive concept is able to read eight (8) bit data through a one-time read operation.

As illustrated in FIGS. 5 and 6, in one variable resistance memory device according to an embodiment of the inventive concept, the number of sense amplifiers 151 through 158 may be more than the number of the writing drivers 141 and 142. In this case, after reading the read data from the memory blocks 211 through 214, a rewriting operation may be repeated through one writing driver to rewrite the (last) read data to the plurality of memory blocks 211 through 214. When the rewriting signal is applied to the sense amplifiers 251 through 258, data stored in the sense amplifier registers 251 through 258 may be sequentially provided to the first and second writing drivers 141 and 142.

Figure 7:
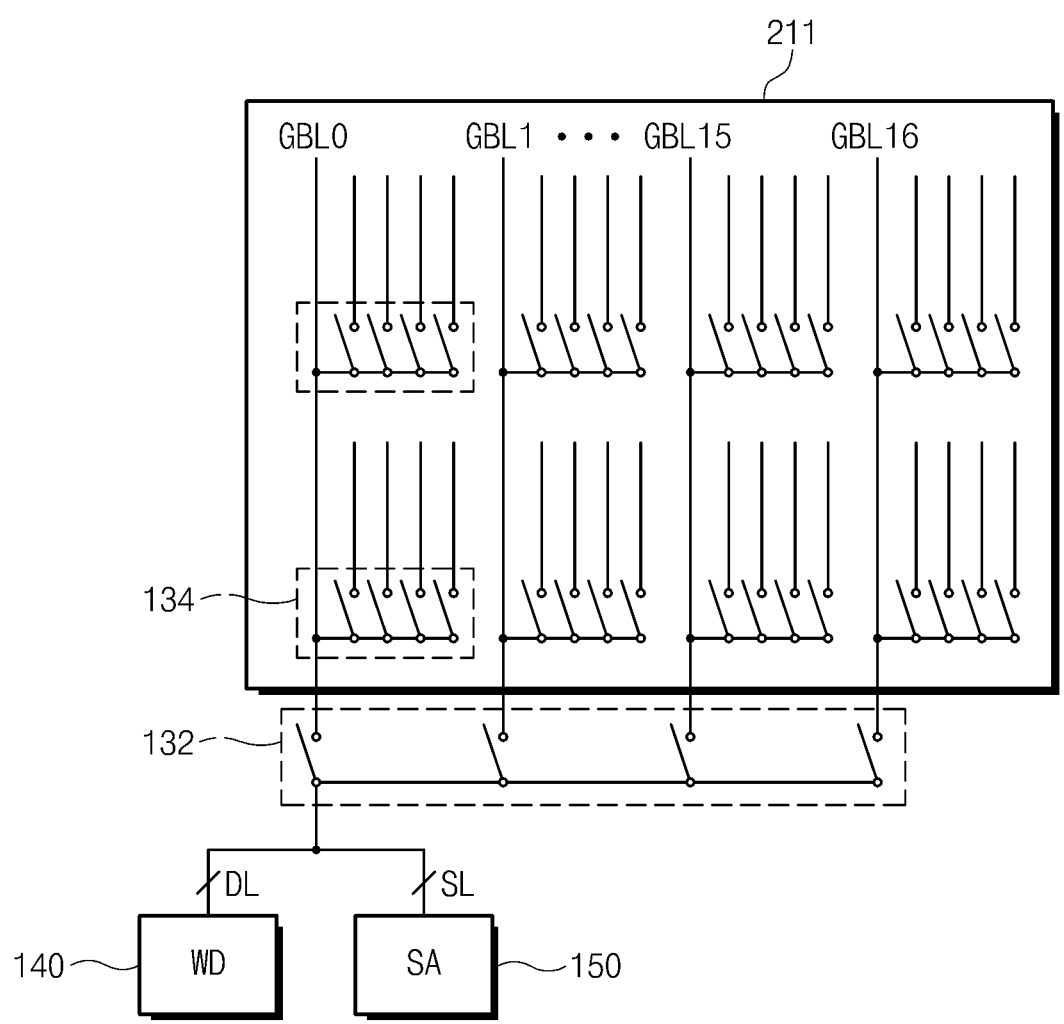
FIG. 7 is a block diagram illustrating a connection among a memory block of a memory cell array, a writing driver and a sense amplifier in a variable resistance memory device in accordance with an embodiment of the inventive concept.
Figure 8:
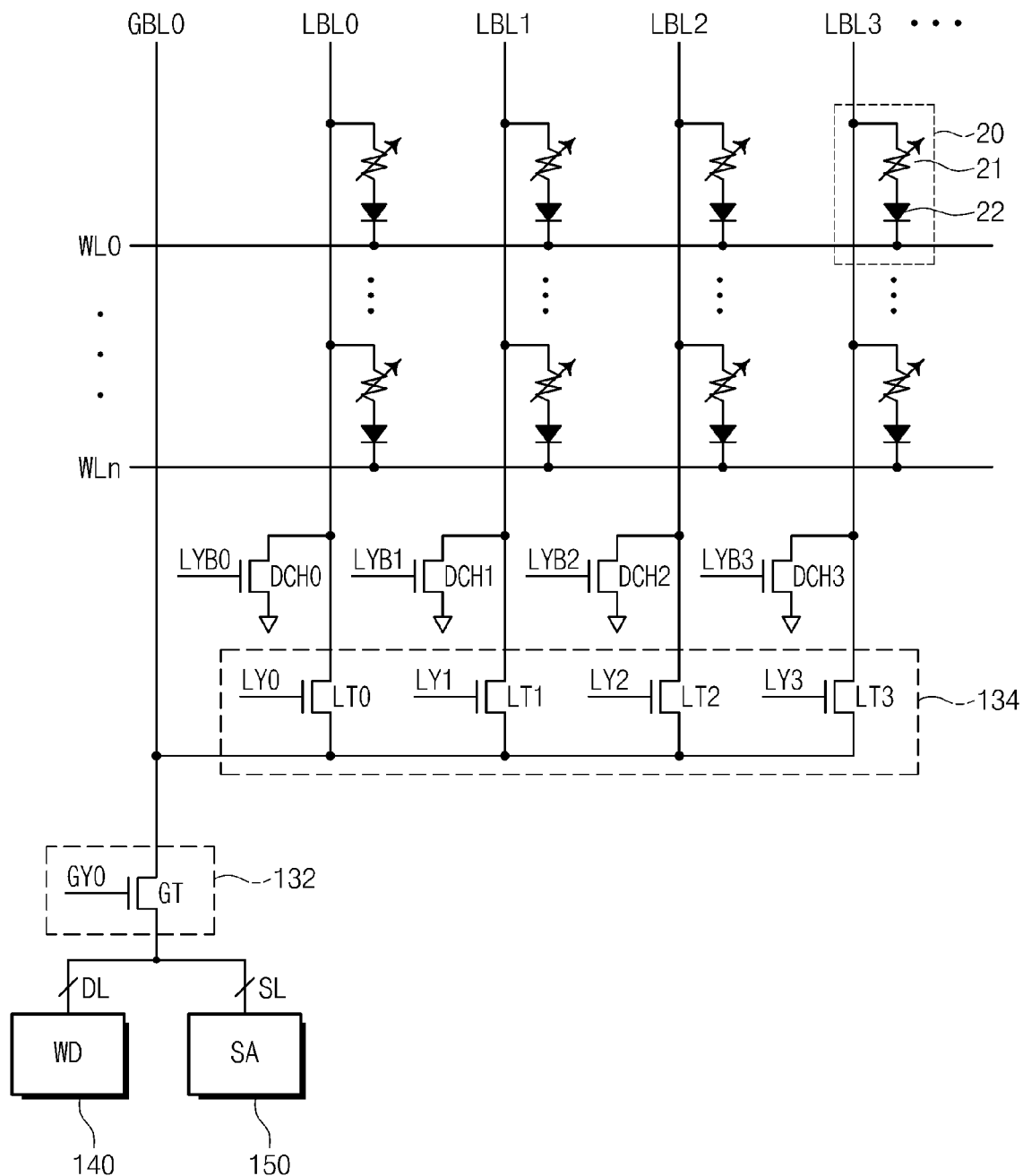
FIG. 8 is a block diagram illustrating a connection among a memory block of a memory cell array, a writing driver and a sense amplifier in a variable resistance memory device in accordance with another embodiment of the inventive concept.

FIG. 7 is a block diagram illustrating another possible connection between a memory block of the memory cell array 110, the writing driver 140 and the sense amplifier 150 in a variable resistance memory device according to an embodiment of the inventive concept. FIG. 8 is a block diagram illustrating yet another possible connection between a memory block of the memory cell array 110, the writing driver 140 and sense amplifier 150 of a variable resistance memory device according to an embodiment of the inventive concept.

Referring to FIGS. 7 and 8, each of memory blocks 211 through 214 has a plurality of word lines (WL0-WLn), a plurality of global bit lines (GB0-GBL16) and a plurality of local bit lines (LBL0-LBL3). Memory cells 20 are connected to points at which the word line (WL0-WLn) and the local bit lines (LBL0-LBLn) cross one another. Each of the memory cells 20 comprises a variable resistance device 21 and a select device 22.

Each memory block 211 may have bit lines of a hierarchical structure. Bit line may include the plurality of global bit lines (GBL0-GBL16) and the plurality of local bit lines (LBL0-LBL3). The plurality of local bit lines (LBL0-LBL3) may be connected to one global bit line (e.g., GBL0). The plurality of memory cells 20 are connected to the local bit lines (LBL0-LBL3).

In a variable resistance memory device including bit lines of a hierarchical structure, to select the memory cell 20, the bit line select signal (Yi of FIG. 3) provided from the address decoder (120 of FIG. 3) may include a local select signal (LYi) to select a local bit line and a global select signal (BYi) to select a global bit line. Also, the bit line selector (130 of FIG. 3) may include a global bit line selector 132 to select a global bit line and a local bit line selector 134 to select a local bit line.

The global bit line selector 132 includes a plurality of global bit line select transistors (GT). Here, the global bit line select transistor (GT) connects a global bit line (e.g., GBL0) to the data line (DL) or to the sense line (SL) in response to the global select signal (GYi).

The local bit line selector 134 may be comprised of local bit line select transistors (LT) connected to each of the local bit lines (LBL0-LBL3). The local bit line select transistors (LT) electrically connect a local bit line (e.g. LBL0) to the selected global bit line (GBL0) in response to local select signals (LY0-LY3).

Discharge transistors (DCH0-DCH3) are connected to the local bit lines (LBL0-LBL3) respectively to discharge voltages of the local bit lines (LBL0-LBL3) before and after a write operation or a read operation. The discharge transistors (DCH0-DCH3) are connected between the local bit lines (LBL0-LBL3) and a ground voltage and discharge the local bit lines (LBL0-LBL3) in response to complementary signals (LYB0-LYB3) of the local select signals (LY0-LY3). When the local bit line select transistors (LT) are turned ON, the discharge transistors (DCH) are turned OFF.

Figure 9:
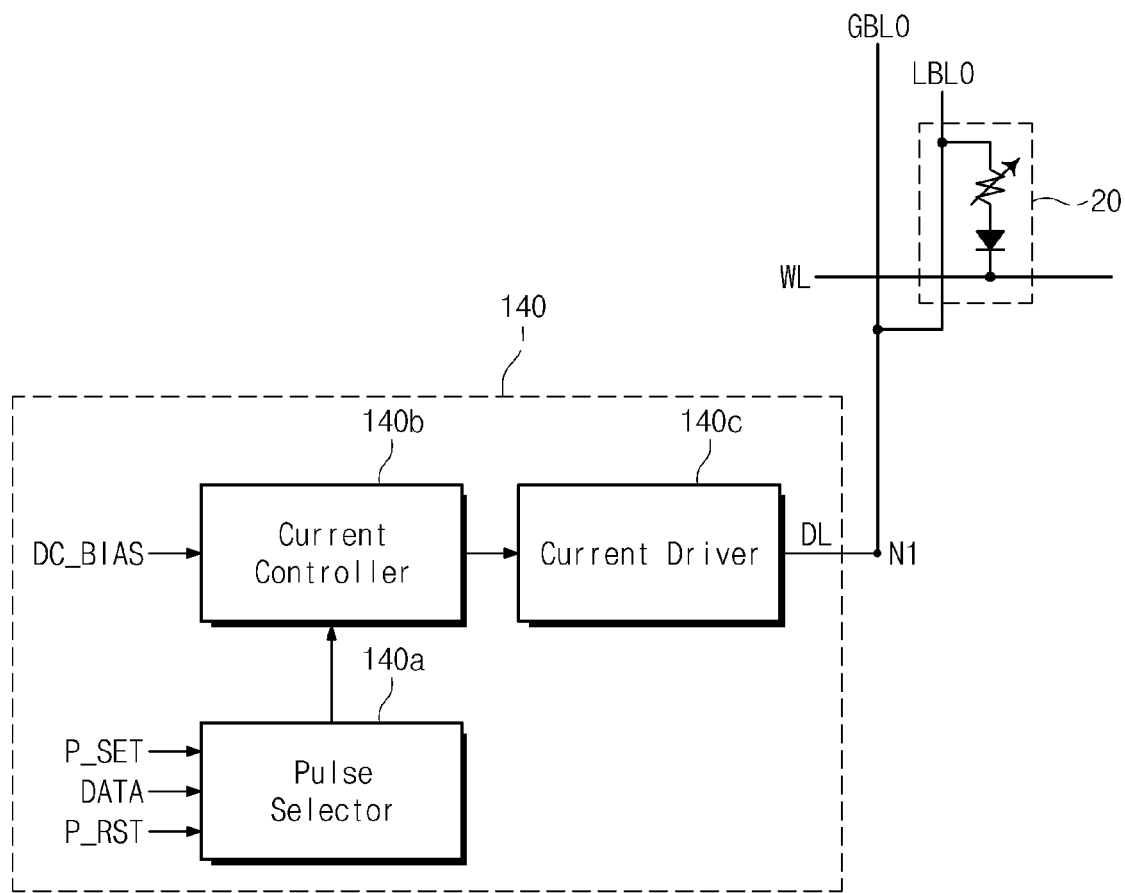
FIG. 9 is a block of the writing driver illustrated in FIGS. 5 through 8.

FIG. 9 is a block diagram of one possible embodiment of a writing driver 140 that may be used in the embodiments illustrated in FIGS. 5 through 8.

Referring to FIG. 9, the writing driver 140 comprises a pulse selector 140a, a current controller 140b and a current driver 140c.

The pulse selector 140a outputs one of a set pulse (P_SET) and a reset pulse (R_RST) according to data (DATA) and provides the outputted signal to the current controller 140b. Here, the set pulse (P_SET) and the reset pulse (R_RST) are a current pulse and an enable section of the reset pulse (R_RST) is shorter than an enable section of the set pulse (P_SET).

The current controller 140b controls the amount of currents to be provided to the current driver 140c during an enable section of the reset pulse (P_RST) or an enable section of the set pulse (P_SET). More specifically, the current controller 140b receives a bias voltage (DC_BIAS) of a fixed level to perform a stable operation. The amount of program currents corresponding to the set pulse (P_SET) and the reset pulse (R_RST) is changed according to a level of the bias voltage (DC_BIAS). That is, the writing driver 140 may increase or may decrease an output level of the current controller 140b in response to a level change of the bias voltage (DC_BIAS).

The current driver 140c provides a set current or a reset current to the selected memory cell 20 through the data line (DL) during an enable section of the reset pulse (P_RST) or an enable section of the set pulse (P_SET), that is, during a writing operation of the memory device in response to an output signal of the current controller 140b. Also, the current driver 140c discharges an output node (N1) during a disable section of the reset pulse (P_RST) or a disable section of the set pulse (P_SET).

Figure 10:
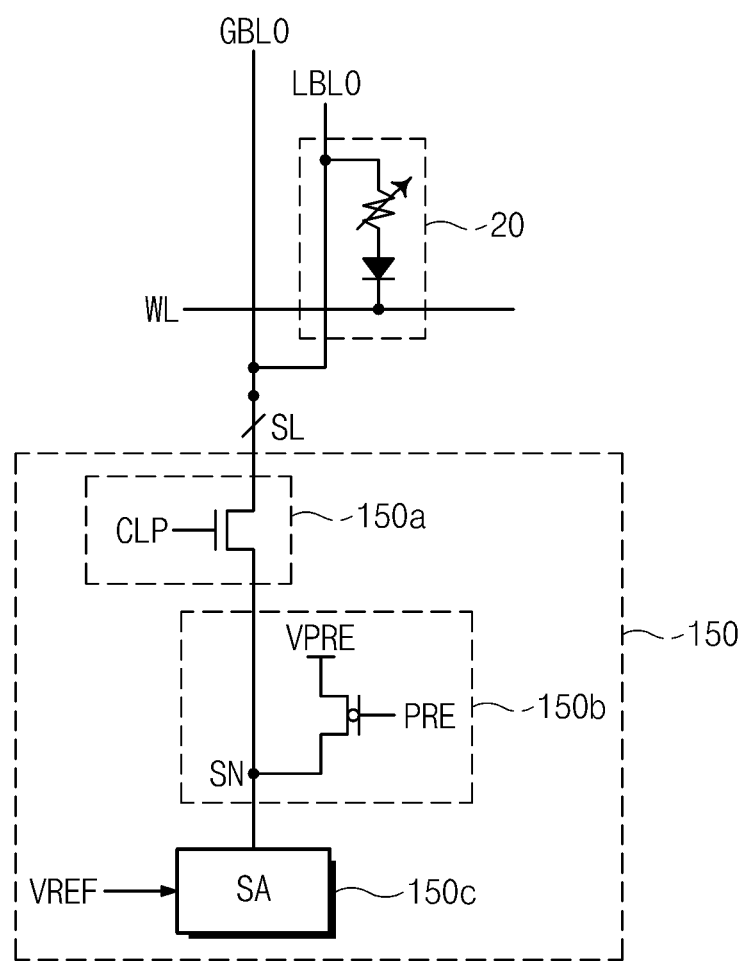
FIG. 10 is a block of the sense amplifier illustrated in FIGS. 5 through 8.

FIG. 10 is a block of one possible sense amplifier that may be incorporated into the embodiments illustrated in FIGS. 5 through 8.

Referring to FIG. 10, the sense amplifier 150 comprises a clamping circuit 150a, a precharge circuit 150b and a sense amplifier 150c.

The precharge circuit 150b precharges a sense node to a precharge voltage level before a read operation. The precharge circuit 150b is connected between a power supply terminal and the sense node (SN). The precharge circuit 150b receives a precharge voltage (VPRE) and precharges the sense node to the precharge voltage (VPRE) in response to a precharge signal (PRE). The precharge signal (PRE) is provided from a controller. When a word line and a bit line are selected by an address decoder, and then a read operation with a read command begins, an operation of the precharge circuit 150b is stopped.

The clamping circuit 150a clamps a sense line (SL) to a predetermined voltage level under a threshold voltage of a phase change material (GST) when a read operation is performed. This is because a phase of a phase change material included in the selected phase change memory cell is changed if a voltage greater than a threshold voltage is applied to the sense line (SL). That is, when a read operation is performed, a clamp control signal (CMP) of a predetermined voltage level is applied to a gate of the clamping circuit 150a and thereby a read current is provided to the selected memory cell 20 by the clamped voltage level and a penetration current is generated according to a resistance of a phase change material.

The sense amplifier 150c receives a reference voltage (VREF) from the controller (170 of FIG. 3) to compare a voltage of the sense node (SN) with the reference voltage (VREF) and output a comparison result when a read operation is performed. That is, as a penetration current is generated from a memory cell, a voltage level of the sense node (SN) is changed. Thus, the sense amplifier 150c reads a logic level of the memory cell 20 by comparing a voltage level of the sense node (SN) with the level of the reference voltage (VREF).

Figure 11:
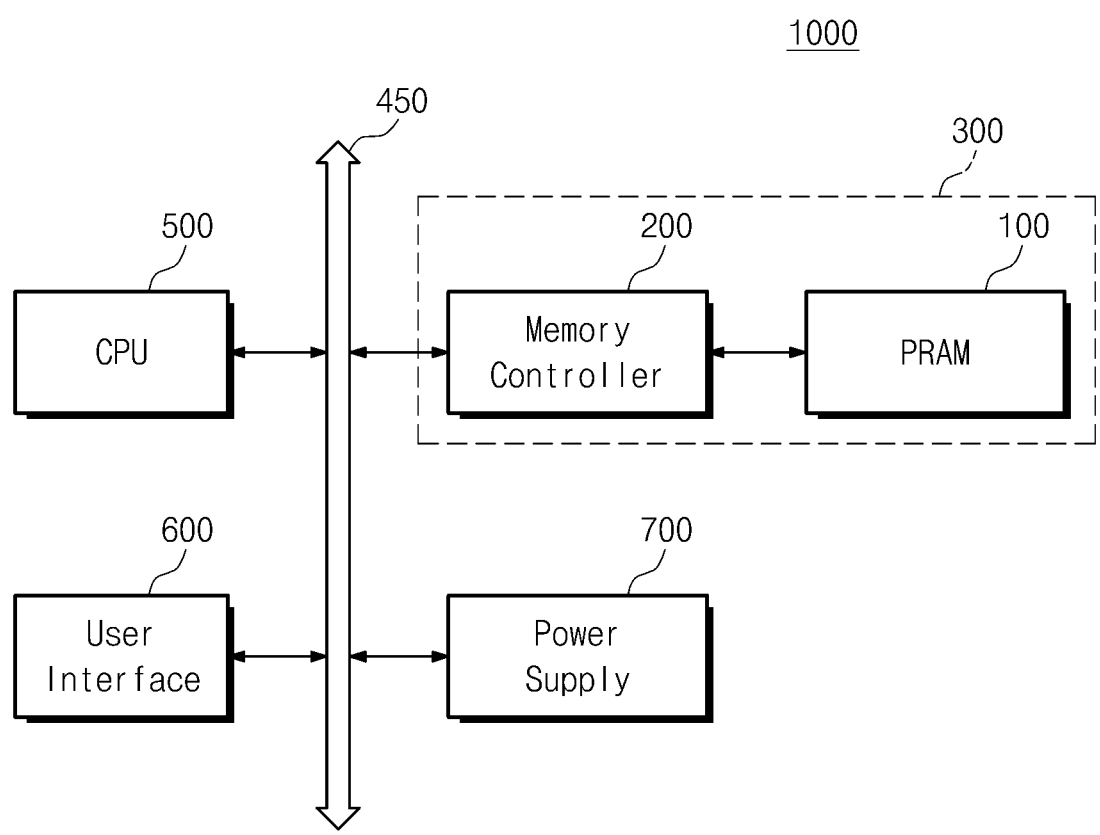
FIG. 11 is a block diagram of a memory system illustrating an application example of a variable resistance memory device in accordance with an embodiment of the inventive concept.

FIG. 11 is a block diagram of a memory system 1000 illustrating an application example of a variable resistance memory device according to an embodiment of the inventive concept.

Referring to FIG. 11, a memory system 1000 comprises a semiconductor memory device 300 comprised of a variable resistance memory device 100 (e.g., PRAM) and a memory controller 200, a central processing unit 500, a user interface 600 and a power supply 700 that are electrically connected to a system bus 450.

Data provided through the user interface 600 or processed by the central processing unit 500 is stored in a variable resistance memory device 100 through the memory controller 200. The variable resistance memory device 100 may be constituted by a solid state drive (SSD). In this case, a writing speed of the memory system 1000 may be greatly improved.

Although not illustrated in the drawings, the memory system in accordance with the present inventive concept may further include an application chipset, a camera image processor (CIS), a mobile DRAM or the like.

According to the variable resistance memory device of the present inventive concept, after repeating a predetermined number of times of data read operations, the read data is rewritten in a memory cell, thereby preventing data loss due to the repeated data read operations. Therefore, reliability of the variable resistance memory device can be improved.

The above-disclosed subject matter is to be considered illustrative, and not restrictive, and the appended claims are intended to cover all such modifications, enhancements, and other embodiments, which fall within the scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A memory system comprising:
 a nonvolatile semiconductor memory device, comprising:
  a memory cell array including a plurality of memory blocks and comprising a plurality of nonvolatile memory cells including a target memory cell; and
  an input/output (I/O) circuit comprising:
   a writing driver commonly connected to the memory blocks to selectively write data in the memory blocks and configured to apply a program current to the target memory cell during a write operation in order to write data to the target memory cell; and
   a sense amplifier commonly connected to the memory blocks to receive read data from the memory blocks and configured to store read data retrieved during a read operation directed to the target memory cell; and
 a controller configured to count a number of consecutive read operations applied to the target memory cell and provide a rewriting signal to the I/O circuit when the counted number of consecutive read operations reaches a defined read operation threshold, wherein the applied rewriting signal causes a data rewriting operation to be executed in the nonvolatile semiconductor memory device rewriting the data to the target memory cell, wherein during the data rewriting operation the writing driver sequentially rewrites read data passed from the sense amplifier in response to the rewriting signal.

2. The system of claim 1, wherein the I/O circuit further comprises a sense amplifier register configured to temporally store read data,
the sense amplifier is further configured to receive the rewriting signal, and
the sense amplifier transfers the read data to the sense amplifier register in response to the rewriting signal.

3. The system of claim 2, wherein during the data rewriting operation, the writing driver is further configured to receive the read data from the sense amplifier register and rewrite the read data in the target memory cell.

4. The system of claim 1, wherein each one of the plurality of nonvolatile memory cells is connected to one of a plurality of local bit lines connected to a plurality of global bit lines.

5. The system of claim 4, further comprising:
a global bit line selector selecting one of the plurality of global bit lines to connect the selected global bit line to the writing driver or the sense amplifier; and
a local bit line selector selecting one of the plurality of local bit lines to connect the selected local bit line to the selected global bit line.

6. The system of claim 1, wherein each one of the plurality of nonvolatile memory cells is a variable resistance memory cell.

7. The system of claim 6, wherein the variable resistance memory cell comprises a phase change material.

8. A method of operating a memory system including a nonvolatile semiconductor memory device comprising a memory cell array including a plurality of memory blocks and comprising a plurality of nonvolatile memory cells including a target memory cell, a writing driver commonly connected to the memory blocks to selectively write data in the memory blocks, and a sense amplifier commonly connected to the memory blocks to receive read data from the memory blocks, the method comprising:
performing a write operation to write data to the target memory cell; and thereafter,
performing a number of consecutive read operations to read data from the target memory cell and counting the number of consecutive read operations; and
when the number of counted consecutive read operations reaches a defined read operation threshold, executing a data rewriting operation to rewrite the data to the target memory cell, wherein during the data rewriting operation, the writing driver sequentially rewrites last read data passed from the sense amplifier in response to the rewriting signal as obtained during a last read operation in the number of counted consecutive read operation.

9. The method of claim 8, wherein the write operation uses a writing driver to write the data to the target memory cell,
each one of the consecutive read operations results in read data being retrieved from the target memory cell and stored in a sense amplifier, and
during the data rewriting operation following the last read operation the last read data is passed from the sense amplifier to the writing driver.

10. The method of claim 8, wherein each one of the plurality of nonvolatile memory cells is connected to one of a plurality of local bit lines connected to a plurality of global bit lines.

11. The method of claim 10, further comprising:
selecting one of the plurality of global bit lines to connect the selected global bit line to the writing driver or the sense amplifier; and
selecting one of the plurality of local bit lines to connect the selected local bit line to the selected global bit line.

12. The method of claim 8, wherein each one of the plurality of nonvolatile memory cells is a variable resistance memory cell.

13. The method of claim 12, wherein the variable resistance memory cell comprises a phase change material.

14. A method of operating a memory system including a nonvolatile semiconductor memory device comprising a memory cell array and an input/output (I/O) circuit, the method comprising:
using a writing driver in the I/O circuit, applying a program current to a target memory cell in the memory cell array during a write operation; and thereafter,
using a sense amplifier in the I/O circuit, performing a number of consecutive read operations to read data from the target memory cell, and counting the number of consecutive read operations until the number of counted consecutive read operations reaches a read operation threshold, and then,
executing a data rewriting operation to rewrite last read data to the target memory cell by passing the last read data stored in the sense amplifier during a last one of the number of counted consecutive read operations to the writing driver, and then using the writing driver to sequentially rewrite the last read data to the target memory cell.

15. The method of claim 14, wherein each one of the plurality of nonvolatile memory cells is a variable resistance memory cell.

16. The method of claim 15, wherein the variable resistance memory cell comprises a phase change material.

* * * * *